(12) United States Patent
Lue

(10) Patent No.: US 7,924,626 B2
(45) Date of Patent: *Apr. 12, 2011

(54) EFFICIENT ERASE ALGORITHM FOR SONOS-TYPE NAND FLASH

(75) Inventor: Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/625,438

(22) Filed: Nov. 24, 2009

(65) Prior Publication Data

US 2010/0067309 A1    Mar. 18, 2010

Related U.S. Application Data

(63) Continuation of application No. 12/052,276, filed on Mar. 20, 2008, now Pat. No. 7,643,349.

(60) Provisional application No. 60/980,793, filed on Oct. 18, 2007.

(51) Int. Cl.
*G11C 16/04* (2006.01)

(52) U.S. Cl. .......... 365/185.24; 365/185.18; 365/185.28

(58) Field of Classification Search ............. 365/185.24, 365/185.03, 185.18, 185.19, 185.28, 185.29, 365/185.33

See application file for complete search history.

(56) References Cited

U.S. PATENT DOCUMENTS

| | | | |
|---|---|---|---|
| RE31,083 E | 11/1982 | DeKeersmaecker et al. | |
| 4,630,086 A | 12/1986 | Sato et al. | |
| 5,286,994 A | 2/1994 | Ozawa et al. | |
| 5,319,229 A | 6/1994 | Shimoji et al. | |
| 5,952,692 A | 9/1999 | Nakazato et al. | |
| 6,011,725 A | 1/2000 | Eitan | |
| 6,026,026 A | 2/2000 | Chan et al. | |
| 6,074,917 A | 6/2000 | Chang et al. | |
| 6,169,693 B1 | 1/2001 | Chan et al. | |
| 6,218,700 B1 | 4/2001 | Papadas | |
| 6,469,343 B1 | 10/2002 | Miura et al. | |
| 6,512,696 B1 | 1/2003 | Fan et al. | |
| 6,605,840 B1 | 8/2003 | Wu | |
| 6,709,928 B1 | 3/2004 | Jenne et al. | |
| 6,720,630 B2 | 4/2004 | Mandelman et al. | |

(Continued)

FOREIGN PATENT DOCUMENTS

EP        0016246        10/1980

(Continued)

OTHER PUBLICATIONS

Aminzadeh et al., "Conduction and Charge Trapping in Polysilicon-Silicon Nitride-Oxide-Silicon Structures under Positive Gate Bias," IEEE Trans. on Electron Dev. 35(4) Apr. 1998 459-467.

(Continued)

*Primary Examiner* — Gene N. Auduong
(74) *Attorney, Agent, or Firm* — Haynes Beffel & Wolfeld LLP

(57) ABSTRACT

A method for operating a dielectric charge trapping memory cell as described herein includes applying an initial voltage from the gate to the substrate of the memory cell for a predetermined period of time to reduce the threshold voltage of the memory cell. The method includes applying a sequence of voltages from the gate to the substrate of the memory cell to further reduce the threshold voltage of the memory cell, wherein a subsequent voltage in the sequence of voltages has a lower magnitude from the gate to the substrate than that of a preceding voltage in the sequence of voltages.

9 Claims, 10 Drawing Sheets

U.S. PATENT DOCUMENTS

| | | | |
|---|---|---|---|
| 6,740,928 | B2 | 5/2004 | Yoshii et al. |
| 6,784,480 | B2 | 8/2004 | Bhattacharyya |
| 6,815,764 | B2 | 11/2004 | Bae et al. |
| 6,818,558 | B1 | 11/2004 | Rathor et al. |
| 6,858,906 | B2 | 2/2005 | Lee et al. |
| 6,897,533 | B1 | 5/2005 | Yang et al. |
| 6,912,163 | B2 | 6/2005 | Zheng et al. |
| 6,977,201 | B2 | 12/2005 | Jung |
| 7,075,828 | B2 | 7/2006 | Lue et al. |
| 7,115,469 | B1 | 10/2006 | Halliyal et al. |
| 7,115,942 | B2 | 10/2006 | Wang |
| 7,133,313 | B2 | 11/2006 | Shih |
| 7,187,590 | B2 | 3/2007 | Zous et al. |
| 7,224,619 | B2 | 5/2007 | Liao et al. |
| 7,463,530 | B2 | 12/2008 | Lue et al. |
| 7,473,589 | B2 | 1/2009 | Lai et al. |
| 2003/0030100 | A1 | 2/2003 | Lee et al. |
| 2003/0032242 | A1 | 2/2003 | Lee et al. |
| 2003/0042534 | A1 | 3/2003 | Bhattacharyya |
| 2003/0047755 | A1 | 3/2003 | Lee et al. |
| 2003/0146465 | A1 | 8/2003 | Wu |
| 2003/0224564 | A1 | 12/2003 | Kang et al. |
| 2004/0079983 | A1 | 4/2004 | Chae et al. |
| 2004/0183126 | A1 | 9/2004 | Bae et al. |
| 2004/0251489 | A1 | 12/2004 | Jeon et al. |
| 2004/0256679 | A1 | 12/2004 | Hu |
| 2005/0006696 | A1 | 1/2005 | Noguchi et al. |
| 2005/0023603 | A1 | 2/2005 | Eldridge et al. |
| 2005/0062098 | A1 | 3/2005 | Mahajani et al. |
| 2005/0074937 | A1 | 4/2005 | Jung |
| 2005/0093054 | A1 | 5/2005 | Jung |
| 2005/0219906 | A1 | 10/2005 | Wu |
| 2005/0237801 | A1 | 10/2005 | Shih |
| 2005/0237809 | A1 | 10/2005 | Shih et al. |
| 2005/0237813 | A1 | 10/2005 | Zous et al. |
| 2005/0237815 | A1 | 10/2005 | Lue et al. |
| 2005/0237816 | A1 | 10/2005 | Lue et al. |
| 2005/0270849 | A1 | 12/2005 | Lue |
| 2005/0281085 | A1 | 12/2005 | Wu |
| 2006/0118858 | A1 | 6/2006 | Jeon et al. |
| 2006/0198189 | A1 | 9/2006 | Lue et al. |
| 2006/0198190 | A1 | 9/2006 | Lue |
| 2006/0202252 | A1 | 9/2006 | Wang et al. |
| 2006/0202261 | A1 | 9/2006 | Lue et al. |
| 2006/0258090 | A1 | 11/2006 | Bhattacharyya et al. |
| 2006/0261401 | A1 | 11/2006 | Bhattacharyya |
| 2006/0281260 | A1 | 12/2006 | Lue |
| 2007/0012988 | A1 | 1/2007 | Bhattacharyya |
| 2007/0029625 | A1 | 2/2007 | Lue et al. |
| 2007/0031999 | A1 | 2/2007 | Ho et al. |
| 2007/0045718 | A1 | 3/2007 | Bhattacharyya |
| 2007/0069283 | A1 | 3/2007 | Shih et al. |
| 2007/0120179 | A1 | 5/2007 | Park et al. |
| 2007/0138539 | A1 | 6/2007 | Wu et al. |
| 2008/0099830 | A1 | 5/2008 | Lue et al. |
| 2008/0116506 | A1 | 5/2008 | Lue |
| 2009/0039417 | A1 | 2/2009 | Chen et al. |

FOREIGN PATENT DOCUMENTS

| | | |
|---|---|---|
| EP | 1411555 | 4/2004 |
| EP | 01677311 | 7/2006 |
| EP | 01677312 | 7/2006 |
| JP | 11040682 A | 2/1999 |
| JP | 2004363329 | 12/2004 |

OTHER PUBLICATIONS

Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4.

Blomme et al., "Multilayer tunneling barriers for nonvolatile memory applications," Device Research Conf, 2002 60th DRC Digest 153-154.

Blomme et al., "Write/Erase Cycling Endurance of Memory Cells with $SiO_2/HfO_2$ Tunnel Dielectric," IEEE Trans. on Dev. and Mterials Reliability 4(3), Sep. 2004 345-351.

Buckley, J., et al., "Engineering of 'Conduction Band-Crested Barriers' or 'Dielectric Constant-Crested Barriers' in view of their application of floating-gate non-volatile memory devices," VLSI 2004, 55-56.

Chindalore, et al., "A New Combination-Erase Technique for Erasing Nitride Based (SONOS) Nonvolatile Memories," IEEE Electron Dev. Lett. 24(4) Apr. 2003, 257-259.

Cho, et al., "Simultaneous Hot-Hole Injection at Drain and Source for Efficient Erase and Excellent Endurance in SONOS Flash EEPROM Cells," IEEE Electron Device Letters, vol. 24, No. 4, Apr. 2003, 260-262.

DiMaria, D.J., et al., "Conduction Studies in Silicon Nitride: Dark Currents and Photocurrents," IBM J. Res. Dev. May 1977, 227-244.

Eitan, et al., "NROM: A Novel Localized Trapping, 2-Bit Nonvolatile Memory Cell," IEEE Electron Device Lett 21(11) Nov. 2000, 543-545.

Govoreanu et al., "An Investigation of the Electron Tunneling Leakage Current Through Ultrathin Oxides/High-k Gate Stacks at Inversion Conditions," IEEE SISPAD Intl. Conf. Sep. 3-5, 2003 287-290.

Govoreanu et al., "Simulation of Nanofloating Gate Memory with High-k Stacked Dielectrics," IEEE SISPAD Intl. Conf. Sep. 3-5, 2003 299-302.

Govoreanu et al., "VARIOT: A Novel Multilayer Tunnel Barrier Concept for Low-Voltage Nonvolatile Memory Devices," IEEE Electron Dev. Lett. 24(2) Feb. 2003 94-10.

Hijiya, S., et al., "High-Speed Write/Erase EAROM Cell with Graded Energy Band-Gap Insulator," Electronics and Communications in Japan, Part 2, vol. 68, No. 2, Jun. 6, 1984, 28-36.

Hinkle, C.L., et al., "Enhanced tunneling in stacked gate dielectrics with ultra-thin $HfO_2$ ($ZrO_2$) layers sandwiched between thicker $SiO_2$ layers," Surface Science, Sep. 20, 2004, vol. 566-568, 1185-1189.

Ito, et al., "A Novel MNOS Technology Using Gate Hole Injection in Erase Operation for Embedded Nonvolatile Memory Applications." 2004 Symp. on VLSI Tech Dig. of Papers 2004, 80-81.

Kim et al., "Robust Multi-Bit Programmable Flash Memory Using a Resonant Tunnel Barrier," Electron Dev. Mtg. Dec. 5-7, 2005, IEDM Technical Digest 861-864.

Kim, Moon Kyung, et al., "The Effects of ONO thickness on Memory Characteristics in Nano-scale Charge Trapping Devices," Int'l Symp on VLIS Technology, Systems and Applications, Apr. 23-25, 2007, pp. 1-2.

Lai, Sheng-Chih, et al., "A Study on the Erase and Retention Mechanisms for MONOS, MANOS, and BE-SONOS Non-Volatile Memory Devices," Int'l Symp on VLSI Technology, Systems and Applications, Apr. 23-25, 2007, pp. 1-2.

Lee, Chang, et al., "A Novel SONOS Structure of $SiO_2/SiL_2O_3$ with TaN Metal Gate for Multi-Giga Bit Flash Memories," IEEE 2003 4 pages.

Lee, Chungho, et al., "Operational and Reliability Comparison of Discrete-Storage Nonvolatile Memories: Advantages of Single-and Double-Layer Metal Nanocrystals," IEEE IEDM 03-557 22.6.1-22.6.4.

Likharev, "Layered Tunnel Barriers for Nonvolatile Memory Devices,"Appl. Phys. Lett. 73(15) Oct. 1998 2137-2139.

Lue et al., "A Novel P-Channel NAND-Type Flash memory 2-bit/cell Operation and High Programming Throughput (>20 MB/sec)," IEEE 2005, 4 pages.

Lue et al., "A BE-SONOS (Bandgap Engineered SONOS) NAND for Post-Floating Gate Era Flash Memory," Int'l Symp on VLSI Tech, Apr. 23-25, 2007, 2 pages.

Lue et al., "BE-SONOS: A Bangap Engineered SONOS with Excellent Performance and Retention Time," IEDM Tech. Digest Dec. 2005 547-550.

Minami, et al., "New Scaling Guidelines for MNOS Nonvolatile Memory Devices," IEEE Trans on Electron Devices 38(11) Nov. 19912519-2526.

Padilla, Alvaro, et al., "Dual-Bit SONOS FinFET Non-Volatile Memory Cell and New Method of Charge Detection," Int'l Symp on VLSI Technology, Systems and Applications, Apr. 23-25,2007, pp. 1-2.

Search Report mailed May 9, 2008 in European Application No. 06000064.3 filed on Jan. 3, 2006, 3 pages.

Search Report mailed May 9, 2008 in European Application No. 06000093.2 (Pub. No. EP-01677312) filed on Jan. 3, 2006, 4 pages.

Search Report mailed Feb. 14, 2007 in European Application No. 06000064.3 filed on Jan. 3, 2006, 7 pages.

Search Report mailed Feb. 14, 2007 in European Application No. 06000093.2 (Pub. No. EP-01677312) filed on Jan. 3, 2006, 7 pages.

Search Report mailed Nov. 14, 2007 in European Application No. 06000064.3 (Pub. No. EP-01677312) filed on Jan. 3, 2006, 4 pages.

Search Report mailed Nov. 14, 2007 in European Application No. 06000093.2 (Pub. No. EP-01677312) filed on Jan. 3, 2006, 4 pages.

Shih et al., "A Novel 2-bit/cell Nitride Storage Flash Memory with Greater than 1M P/E-cycle Endurance," IEEE IEDM 2004 881-884 (36.3.1-36.3.4).

Sung et al., "Multi-Layer SONOS with Direct Tunnel Oxide for High Speed and Long Retention Time," IEEE Silicon Nanoelectronics Workshop Jun. 2002 83-84.

Takata, M., et al., "New Non-Volatile Memory with Extremely High Density Metal Nano-Dots," IEEE IEDM 03-553, 22.5.1-22.5.4.

Tsai et al., "Novel SONOS-Type Nonvolatile Memory Device with Suitable Band Offset in HfAlO Charge-Trapping Layer," Int'l Symp. on VLSI Tech, Systems and Applications Apr. 23-25, 2007, 2 pages.

Walker et al., "3D TFT-SONOS Memory Cell for Ultra-High Density File Storage Applications," 2003 Symposium on VLSI Tech Digest of Technical Papers, 29-30.

Wen, Huang-Chun, et al., "Issues associated with p-type band-edge effective work function metal electrodes: Fermi-level pinning and flatband roll-off," Int'l Sympon VLSI Technology, Systems and Applications, Apr. 23-25, 2007, pp. 1-2.

White et al., "On the Go with SONOS" IEEE Circuits and Devicces, Jul. 2000, 22-31.

Wu, W.-C., et al., "Highly Reliable Multilevel and 2-bit/cell Operation of Wrapped Select Gate (WSG) SONOS Memory," IEEE Electron Device Letters, vol. 28, Issue 3, Mar. 2007, 214-216.

Yamada et al., "A self-convergence erasing scheme for a simple stacked gate flash EEPROM," Proc. Int'l. Electron Devices Meeting, Dec. 1991 307-310.

Yeh, C.C., et al., "Phines: A Novel Low Power Program/Erase, Small Pitch 2-Bit per Cell Flash Memory," IEDM Tech. Dig. 2002, 931-934.

EFFICIENT ERASE ALGORITHM FOR SONOS-TYPE NAND FLASH

CROSS-REFERENCE TO RELATED APPLICATIONS

This application is a continuation of copending U.S. patent application Ser. No. 12/052,276 filed 20 Mar. 2008; which application claims the benefit of U.S. Provisional Application 60/980,793, filed 18 Oct. 2007, entitled Efficient Erase Algorism for SONOS-Type NAND Flash, which applications are incorporated by reference herein.

BACKGROUND OF THE INVENTION

1. Field of the Invention

The present invention relates to flash memory technology, and more particularly to methods for erasing charge trapping memory cells having dielectric charge trapping structures.

2. Description of Related Art

Flash memory is a class of non-volatile integrated circuit memory technology. Traditional flash memory employs floating gate memory cells storing charge on an electrically conductive layer between the channel and gate of a transistor. The charge stored affects the threshold voltage of the transistor, and the threshold voltage of the transistor due to the stored charge can be sensed to indicate data.

As the density of floating gate memory cells increases, interference between the charge stored on adjacent floating gates limits the ability to increase the density of floating gate based memory.

Another type of memory cell based on storing charge between the channel and gate of a transistor uses a dielectric charge trapping structure to store charge. Dielectric charge trapping memory cells do not cause cell-to-cell interference like that encountered with floating gate technology, and thus are expected to be implemented in higher density flash memory.

In dielectric charge trapping memory cells, a dielectric charge storage layer is formed over a tunneling dielectric which isolates the charge storage layer from a channel region of a semiconductor substrate, and a blocking dielectric layer is formed over the charge storage layer to isolate it from a gate. A representative device is known as a silicon-oxide-nitride-oxide-silicon SONOS cell.

SONOS-type devices can be programmed by tunneling of electrons into the charge storage layer using one of a number of well-known biasing techniques (for example, Fowler Nordheim (FN) tunneling, Channel Hot Electron (CHE), etc).

SONOS-type devices can be erased by hole tunneling into the charge storage layer or by electron de-trapping from the charge storage layer. Since electrons in the dielectric charge storage layer are not free to move, hole tunneling may be preferred in order to achieve practical erase operation speeds.

During erase, injection of electrons from the gate into the dielectric charge storage layer results in an erase saturation condition in which the charge in the charge storage layer converges to an equilibrium level, thus limiting the minimum threshold voltage of the memory cell. See, U.S. Pat. No. 7,075,828, entitled "Operation Scheme with Charge Balancing Erase for Charge Trapping Non-Volatile Memory", invented by Lue et al.

It is desirable to obtain low erase threshold voltages, particularly for memory cells arranged in a NAND array, because it allows for lower voltage operations of the memory cell during read and program operations. Additionally, if the erased threshold voltage is too high the memory window between the programmed and erased threshold states may become too small for many applications.

Conventional biasing techniques for achieving a lower erase threshold voltage result in a slower erase speed since a lower magnitude voltage between the gate and channel of the memory cell must be applied.

Other techniques for achieving lower erase threshold voltage memory cells include reducing the injection of electrons from the gate by employing a high work function gate material and/or a high dielectric constant material in the blocking dielectric layer. However, the problem of erase saturation continues to limit performance of dielectric charge trapping memory cells.

Accordingly, it is desirable to provide efficient methods for erasing dielectric charge trapping memory cells which address the erase saturation issues and result in lower erase threshold voltages.

SUMMARY OF THE INVENTION

A method for operating a dielectric charge trapping memory cell as described herein includes applying an initial voltage from the gate to the substrate of the memory cell for a predetermined period of time to reduce the threshold voltage of the memory cell. The method includes applying a sequence of voltages from the gate to the substrate of the memory cell to further reduce the threshold voltage of the memory cell, wherein a subsequent voltage in the sequence of voltages has a lower magnitude from the gate to the substrate than that of a preceding voltage in the sequence of voltages.

A memory device described herein includes a dielectric charge trapping memory cell having a threshold voltage and comprising a substrate including a channel region, a dielectric charge trapping structure overlying the channel region, and a gate overlying the dielectric charge trapping structure. The memory device also includes a bias arrangement state machine to apply a bias arrangement for adjusting the memory cell. The bias arrangement for adjusting comprising an initial voltage from the gate to the substrate of the memory cell applied for a predetermined period of time to reduce the threshold voltage of the memory cell. The bias arrangement for adjusting further comprises a sequence of voltages applied from the gate to the substrate of the memory cell to further reduce the threshold voltage of the memory cell, wherein a subsequent voltage in the sequence of voltages has a lower magnitude from the gate to the substrate than that of a preceding voltage in the sequence of voltages.

Erase saturation occurs when the charge stored in the dielectric charge trapping layer reaches an equilibrium value due to electron injection from one of the gate and substrate and hole tunneling from the other of the gate and substrate. A strong electric field between the gate and the substrate increases the erase speed of the device, but also increases the electron injection and leads to a higher erase saturation voltage for the device. The present invention initially applies a bias to create a strong electric field between the gate and the substrate so as to increase the erase speed of the device, and then changes the bias to reduce the electric field between the gate and the substrate so as to avoid erase saturation and obtain a lower threshold voltage. Thus, memory cells can be erased more quickly while also avoiding the issues of erase saturation.

Other aspects and advantages of the present invention can be seen on review of the drawings, the detailed description and the claims, which follow.

DETAILED DESCRIPTION

A detailed description of embodiments of the present invention is provided with reference to FIGS. 1-11.

Figure 1:
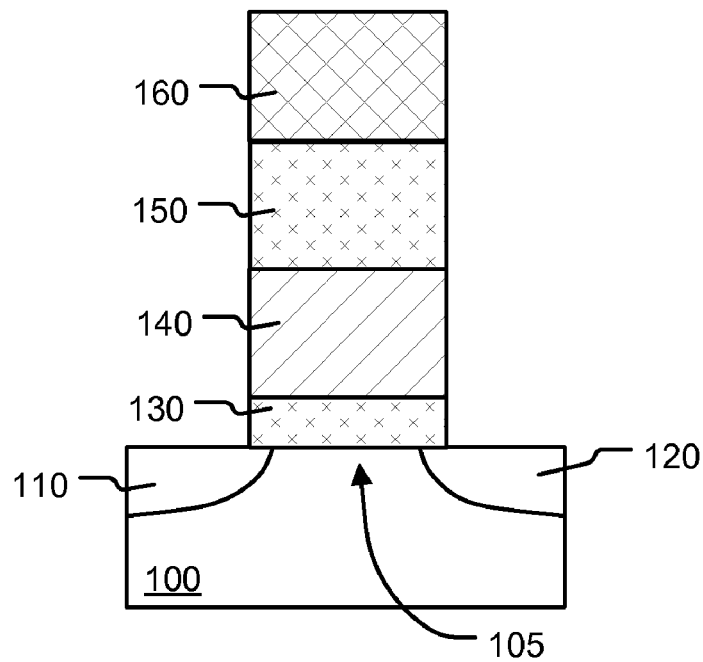
FIG. 1 illustrates a cross-sectional view of a prior art SONOS memory cell.
Figure 2:
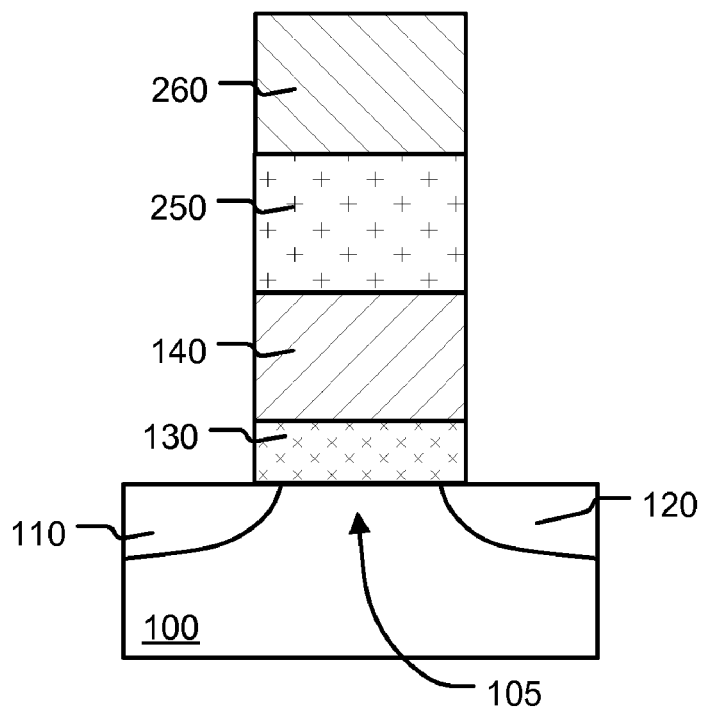
FIG. 2 illustrates a cross-sectional view of a prior art MONOS memory cell.
Figure 3:
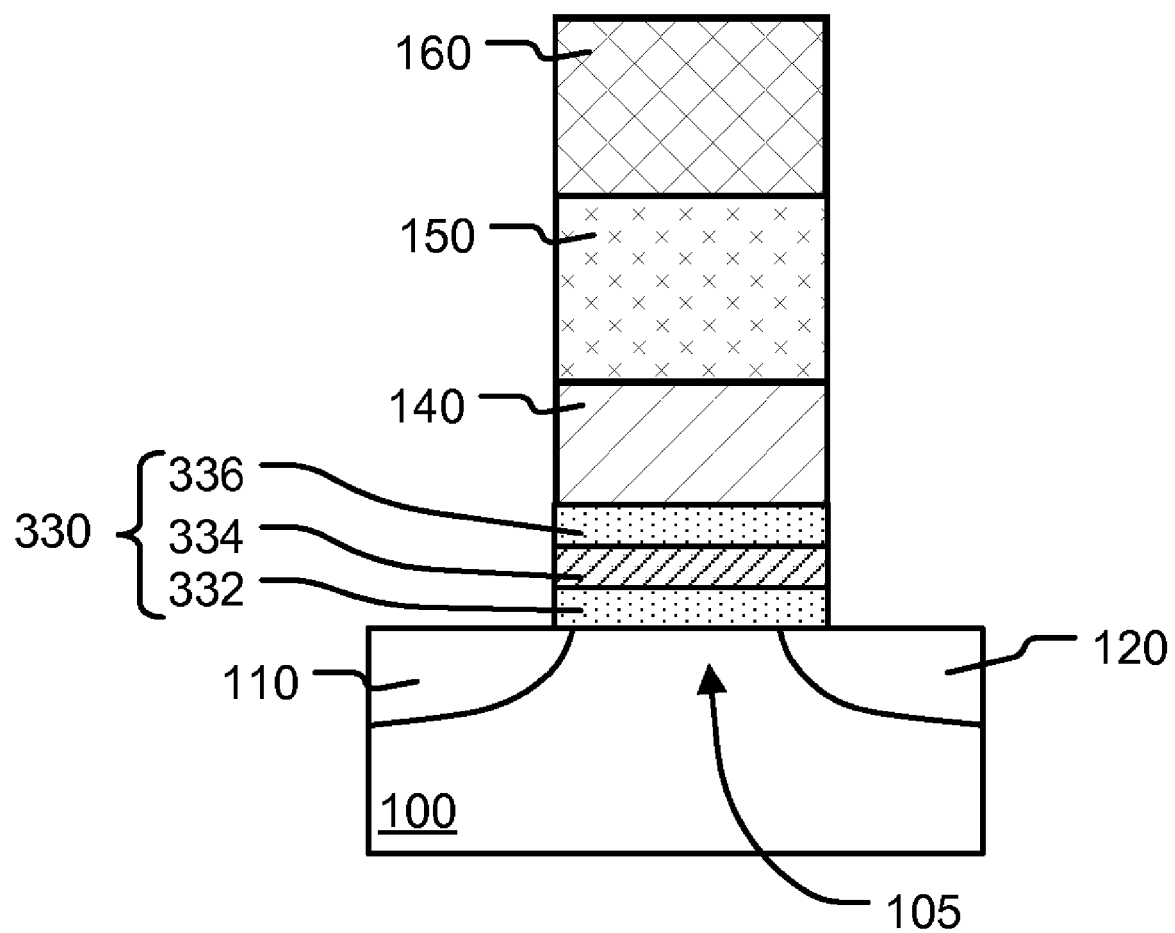
FIG. 3 illustrates a cross-sectional view of a prior art BE-SONOS memory cell.

FIGS. 1-3 are cross-sectional views of prior art dielectric charge trapping memory cells (not to scale). FIG. 1 illustrates a SONOS memory cell formed on a semiconductor substrate 100. Doped regions 110, 120 acting as source and drain regions respectively are separated by a channel region 105. The doped regions 110, 120 have a conductivity type opposite that of substrate 100.

A tunneling dielectric layer 130 comprising silicon dioxide or silicon oxynitride having a thickness of 2 to 4 nm overlies the channel region 105, a dielectric charge storage layer 140 comprises silicon nitride in this example greater than 5 nm thick (such as about 7 nm) is on the tunneling dielectric layer 130, a blocking dielectric layer 150 comprises silicon dioxide in this example greater than 5 nm thick (such as about 9 nm) is on the charge storage layer 140, and a gate 160 for example comprising p-type or n-type polysilicon is on the blocking dielectric layer 150. Alternative embodiments using a multi-layer blocking layer can be implemented. A higher work function material may be used in addition to or in place of the polysilicon in contact with the blocking layer 150, such as tantalum, titanium, platinum, tantalum nitride, titanium nitride and so on.

The memory cell is programmed and erased by applying appropriate voltages to the gate 160 and substrate 100 of the memory cell to induce an electric field between the gate 160 and substrate 100. The memory cell can be programmed by tunneling of electrons into the charge storage layer 140 using one of a number of well-known biasing techniques (for example, Fowler Nordheim (FN) tunneling, Channel Hot Electron (CHE), etc.). The memory cell can be erased by hole tunneling from the substrate 100 into the charge storage layer 140 or by electron de-trapping from the charge storage layer 140.

In conductive floating gate devices the electrons are free to move on the floating gate and are thus able to tunnel through a tunneling layer and into the substrate sufficiently quickly for many applications. However, in dielectric charge trapping memory cells the charge is trapped in the charge storage layer 140, resulting in slow erase speeds using electron de-trapping erase methods. Thus, hole tunneling may be necessary for acceptable erase speeds.

It has been observed that a thin (less than ~3 nm) tunneling dielectric layer 130 results in a SONOS memory cell having poor charge retention properties due to the direct tunneling of electrons through the layer 130 even under low electric fields. However, increasing the thickness of the tunneling dielectric layer 130 necessitates a larger electric field to achieve a hole current density sufficient for adequate erase speeds. However, a larger electric field will also increase the electron injection from the gate 160 and result in a higher erase saturation voltage for the device. The larger electric field may also cause electron injection that is greater than the hole current, thus preventing the memory cell threshold voltage from being reduced.

Techniques for achieving lower erase threshold voltages for dielectric charge trapping memory cells include reducing the injection of electrons from the gate by employing a high work function gate material and/or high dielectric constant material in the blocking dielectric layer. Examples of such devices include MONOS-type devices. FIG. 2 illustrates a prior art MONOS device in which a blocking dielectric layer 250 comprises a high dielectric constant material (such as $Al_2O_3$) and a gate 260 comprises a relatively high work function material (such as tantalum nitride). The relatively high work function material of the gate 260 inhibits electron injection through the blocking dielectric layer 250, and the high dielectric constant of the blocking dielectric layer 250 reduces the magnitude of the electric field through the blocking dielectric layer 250 relative to the electric field for the tunneling dielectric layer 130. A variety of high work function materials suitable for use as a gate material are described in U.S. Pat. No. 6,912,163, which is incorporated by reference herein. Although MONOS-type devices can reduce gate injection and thus lower the erase saturation voltage, the same issues of charge retention, erase saturation, and erase time discussed above with reference to the SONOS device of FIG. 1 remain.

Approaches have also been made to improve the performance of the tunneling dielectric in order to achieve erase using lower electric fields. FIG. 3 illustrates a prior art Bandgap Engineered SONOS (BE-SONOS) device having a tunneling dielectric structure 330 separating the charge storage layer 140 from the channel 105. The tunneling dielectric structure 330 comprises a bottom dielectric layer 332 of silicon dioxide less than 2 nm thick (such as about 1.3 nm), a middle dielectric layer 334 of silicon nitride less than 2.5 nm thick (such as about 2 nm) on the bottom dielectric layer 332, and a top dielectric layer 336 of silicon dioxide less than 3.5 nm thick (such as about 2.5 nm) on the middle dielectric layer 334. The charge storage layer 140 comprises silicon nitride in this example greater than 5 nm thick (such as about 7 nm) or other charge trapping dielectric material, and the blocking layer 150 comprises silicon dioxide in this example greater than 5 nm thick (such as about 9 nm). Alternative embodiments using a multilayer blocking layer, or a high dielectric constant material like $Al_2O_3$, can be implemented. Also, the gate may comprise p-type or n-type polysilicon. A high work function material may be used in addition to or in place of the polysilicon in contact with the blocking layer 150, such as tantalum, titanium, platinum, tantalum nitride, and so on. For further information on BE-SONOS devices, see U.S. Patent Application Publication No. US 2006/0198189 A1, "Non-Volatile Memory Cells, Memory Arrays Including the Same and Methods of Operating Cells and Arrays", which is incorporated by reference herein.

BE-SONOS technology has been proven to provide excellent performance, overcoming many of the erase speed, endurance and charge retention issues of prior art SONOS type memory.

However, as described in more detail below with reference to FIG. 4, the problem of erase saturation continues to limit operational parameters of dielectric charge trapping memory cells.

Figure 4:
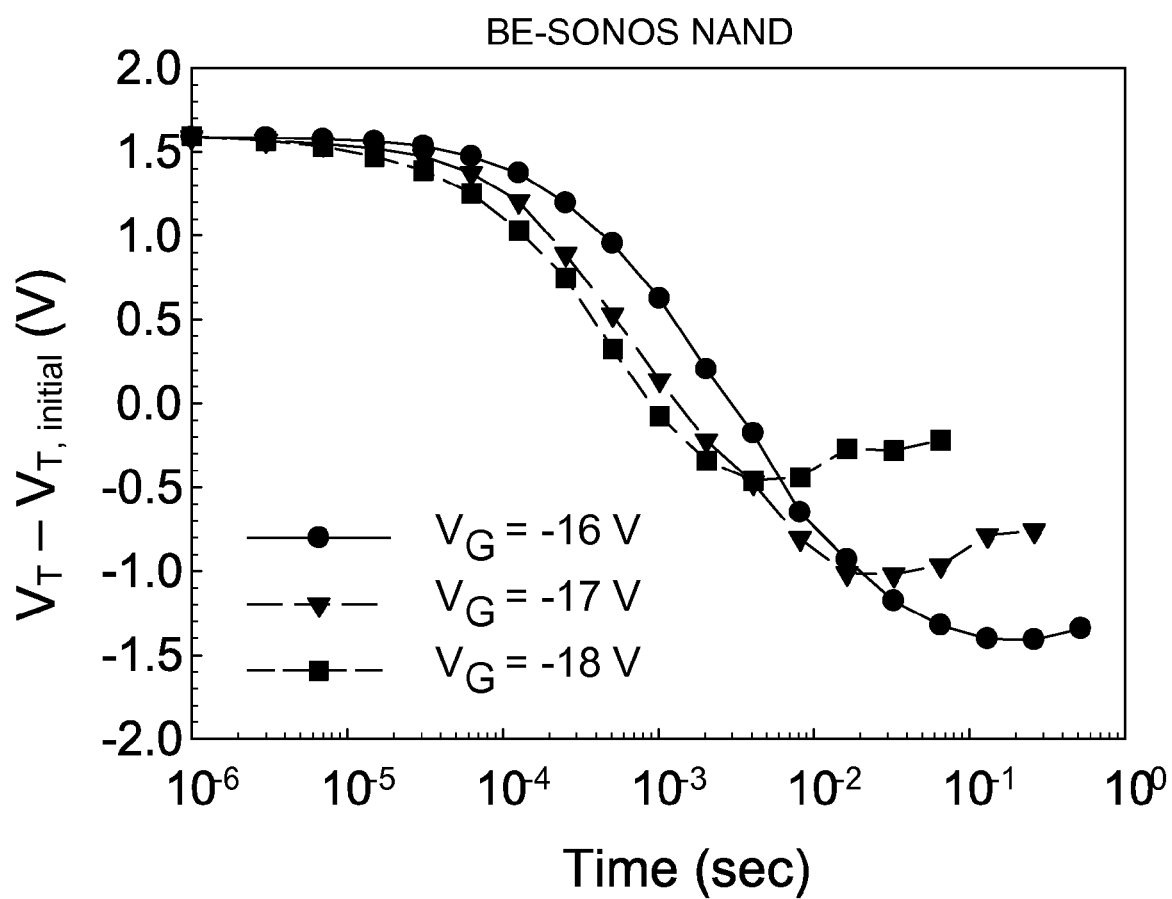
FIG. 4 illustrates erase speeds and erase saturation voltages for various gate voltages applied to an exemplary BE-SONOS memory cell arranged in a NAND configuration.

FIG. 4 illustrates erase speeds and erase saturation voltages for various gate voltages applied to an exemplary BE-SONOS memory cell arranged in a NAND configuration. The substrate is grounded in these examples, so that the gate voltage $V_G$ represents the voltage between the gate and the substrate of the memory cell. As can be seen in the Figure, a higher magnitude gate voltage results in a faster initial erase speed (less than 1 msec for $V_G=-18V$) but also results in reaching erase saturation more quickly. As used herein, the "magnitude" of the voltage from the gate to the substrate refers to the absolute value of the voltage between the gate and substrate.

As can be seen in FIG. 4, to obtain a lower erase saturation voltage a lower magnitude gate voltage must be applied. However, applying a lower magnitude gate voltage will also result in a slower erase speed for the memory cell.

Figure 5:
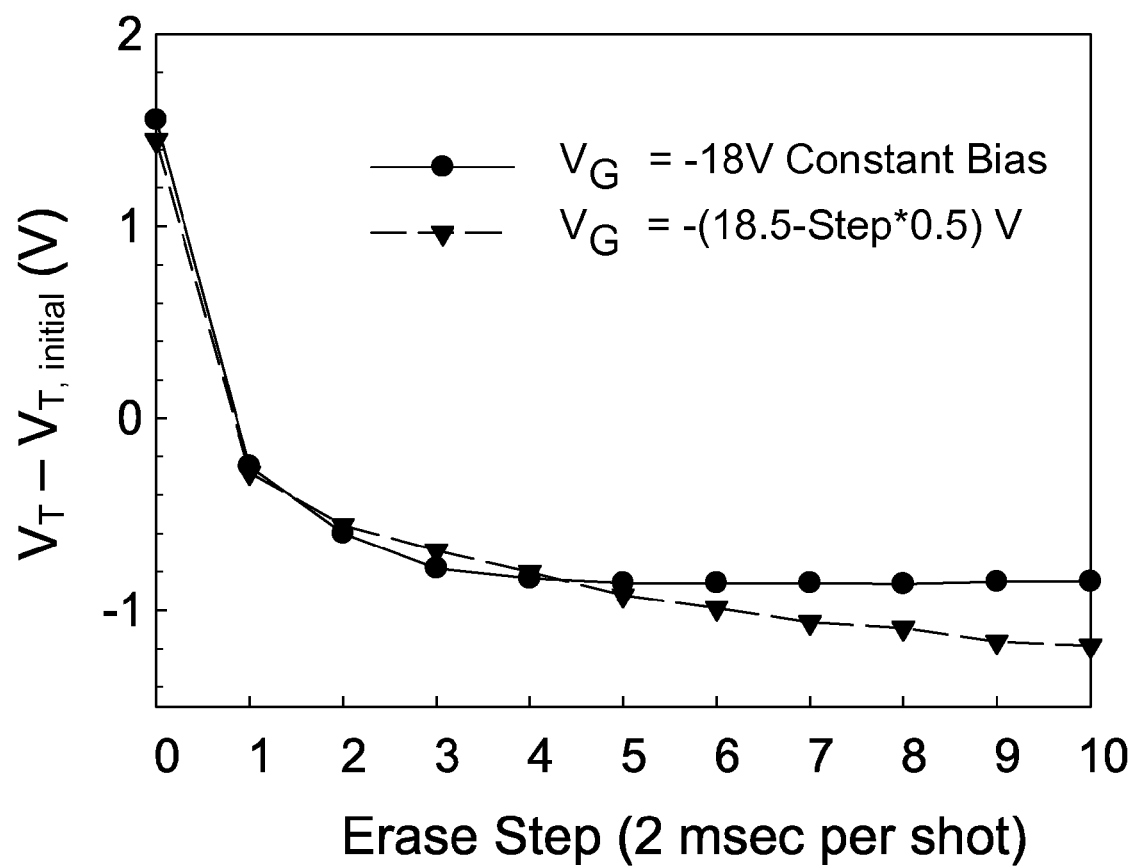
FIG. 5 illustrates an efficient erase algorithm for erasing a dielectric charge trapping memory cell to a lower threshold voltage.

FIG. 5 illustrates an efficient technique for erasing a dielectric charge trapping memory cell to a lower threshold voltage.

Shown in FIG. 5 is the change in threshold voltage versus the erase step (erase shot number) using a gate voltage of −18 V applied in 2 msec shots to an exemplary BE-SONOS device arranged in a NAND configuration. The substrate is grounded in this example, so that the gate voltage $V_G$ represents the voltage between the gate and substrate of the memory cell. Due to the injection of electrons from the gate, applying a constant voltage for each of the erase steps causes the memory cell to eventually reach an erase saturation voltage such that additional erase steps do not further reduce the threshold voltage of the cell.

Also shown in FIG. 5 is an efficient technique for erasing the exemplary BE-SONOS device. In FIG. 5, the voltage applied to the gate of the device changes according to equation (1) and the substrate is grounded to induce Fowler Nordheim hole tunneling from the substrate to the dielectric charge trapping structure:

$$V_G = -(18.5 - \text{Step} \cdot 0.5) \text{Volts} \quad (1)$$

Because a faster erase speed is obtained by using a larger magnitude erase voltage, for the first erase step a large magnitude erase voltage is applied (−18 V in FIG. 5) from the gate to the substrate for a predetermined period of time (2 msec in FIG. 5). For the second erase step, the magnitude of the applied erase voltage from the gate to the substrate is reduced (−17.5 V in FIG. 5). The magnitude of the applied erase voltage from the gate to the substrate continues to be decreased according to equation (1) for each subsequent erase step. In FIG. 5, the substrate is maintained at 0 Volts although it will be understood that the substrate can be set to other voltages.

Since a lower magnitude gate voltage results in a lower erase saturation voltage for the device, by applying a lower magnitude gate voltage in subsequent erase steps the threshold voltage of the memory cell can continue to be decreased for each erase step and the erase saturation issues described above can be avoided.

Also, since a higher magnitude gate voltage results in a faster initial erase speed, by applying a larger magnitude initial gate voltage a faster erase speed is achieved compared to a constant lower magnitude gate voltage. In FIG. 5 the initial voltage from the gate to the substrate is −18 Volts, although it will be understood that other values can be used as well.

Figure 6:
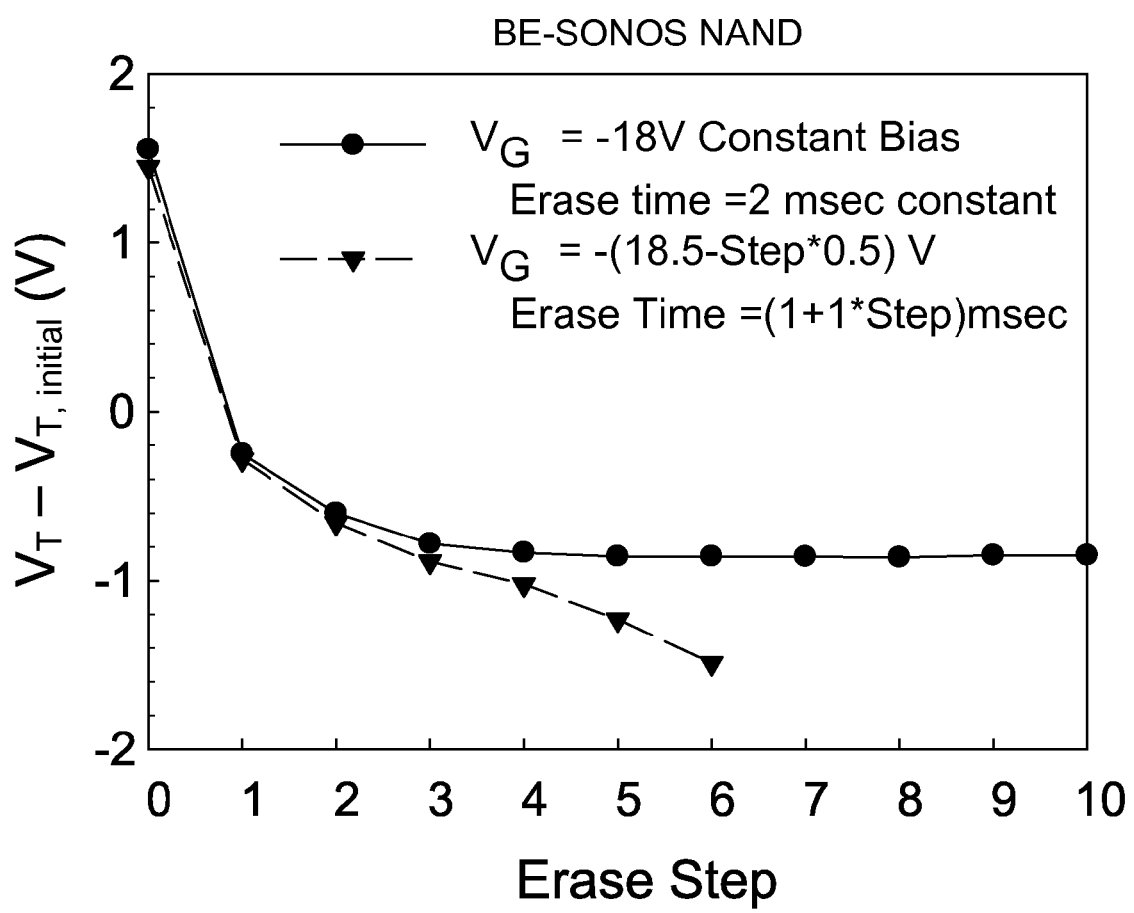
FIG. 6 illustrates an efficient erase algorithm for erasing a dielectric charge trapping memory cell to a lower threshold voltage.

In FIG. 5, each erase step was applied for the same period of time (2 msec). FIG. 6 shows an alternative to that of FIG. 5, in which the erase time is increased for each subsequent erase step according to equation (2):

$$\text{Erase Time} = (1 + 1 \cdot \text{Step}) \text{msec} \quad (2)$$

Since a lower magnitude gate voltage results in a longer period of time to change the threshold voltage a given amount, by increasing the erase time for each erase step the threshold voltage of the memory cell can be lowered in a more efficient manner.

Although FIGS. 5 and 6 illustrate the efficient erase of an exemplary BE-SONOS device using FN hole tunneling from the substrate to the dielectric charge trapping structure, it will be understood that the efficient techniques for erasing described herein can be applied to other types of dielectric charge trapping devices.

In the erase algorithms of FIGS. 5 and 6, the substrate is grounded. Alternatively, the substrate may be set to a voltage other than ground.

In FIG. 5 and FIG. 6, the reduction in the gate voltage between successive erase steps was a constant value of 0.5 Volts, although it will be understood that other values can be used as well. Other methods for decreasing the gate voltage, including decreasing in a non-linear stepped fashion or a combination of linear and non-linear fashions can also be used. Additionally, other techniques for reducing the magnitude of the voltage from the gate to the substrate may also be used including changing the bias of the substrate or changing the bias of both the gate and the substrate.

In FIG. 6, the erase time is increased at a constant rate of one millisecond per step, although it will be understood that other rates can also be used. Other linear and/or non-linear methods for increasing the erase time for each step can also be used.

In FIGS. 5 and 6, the magnitude of the bias voltage from the gate to the substrate is reduced for each erase step, although the present invention is not limited to such. Generally, for a sequence of voltages applied from the gate to the substrate, the threshold voltage of the memory cell can be reduced so long as at least one subsequent voltage in the sequence has a lower magnitude than that of a preceding voltage. For example, in a sequence of voltages more than one erase step may have the same magnitude voltage applied from the gate to the substrate.

In a representative embodiment of erasing a memory cell using hole tunneling from the substrate, the initial bias voltage between the gate and substrate is between −10 and −20 Volts, the reduction in voltage magnitude between successive steps is between about 0.2 and 1.0 Volts, and each erase step is applied for between about 0.5 and 3 msec. In another representative embodiment the initial bias voltage between the gate and substrate is between −10 and −20 Volts applied for between about 0.5 and 3 msec, the reduction in voltage magnitude between successive steps is between 0.2 and 1.0 Volts, and the erase time is increased between 0.5 and 2 msec per step.

In the efficient techniques for erasing illustrated in FIGS. 5 and 6 and variations described above, erasing was accomplished by hole tunneling from the substrate to the dielectric charge trapping structure, although the present invention is not limited to such. Erase saturation can also occur when the charge stored in the dielectric charge trapping layer reaches an equilibrium value due to electron injection from substrate and hole tunneling from the gate.

Figure 7:
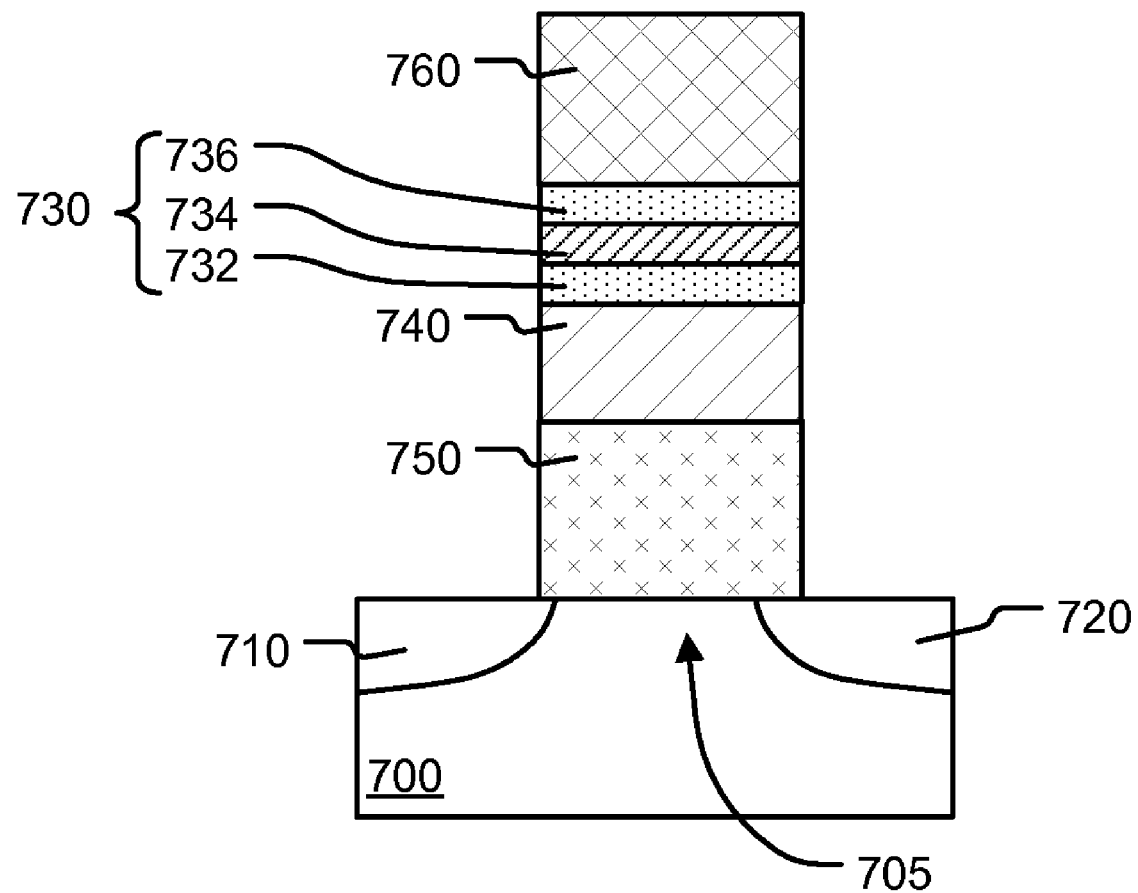
FIG. 7 illustrates a cross-sectional view of a prior art BE-SONOS memory cell which can be erased by hole tunneling from the gate to the dielectric charge trapping layer.

FIG. 7 illustrates a cross-sectional view of a prior-art BE-SONOS memory cell which can be erased by hole tunneling from the gate 760 to the dielectric charge trapping layer 740. The memory cell includes doped regions 710, 720 acting as source and drain regions respectively and separated by a channel region 705 within a substrate 700. A blocking dielectric layer 750 overlies the channel region 705, a dielectric charge trapping layer 740 is on the blocking dielectric layer 750, and a tunneling dielectric structure 730 is between the dielectric charge trapping structure 740 and the gate 760. The tunneling dielectric structure 730 comprises a first dielectric layer 732 of silicon dioxide less than 3.5 nm thick (such as about 2.5 nm), a second dielectric layer 734 of silicon nitride less than 2.5 nm thick (such as about 2 nm) on the first dielectric layer 732, and a third dielectric layer 736 of silicon dioxide less than 2 nm thick (such as about 1.3 nm) on the second dielectric layer 734. The charge trapping layer 740 comprises silicon nitride in this example greater than 5 nm thick (such as about 7 nm) or other charge trapping dielectric material, and the blocking layer 750 comprises silicon dioxide in this example greater than 5 nm thick (such as about 9 nm). Alternative embodiments using a multilayer blocking layer, or a high dielectric constant material like $Al_2O_3$ can be implemented. Also the gate 760 may comprise p-type or n-type polysilicon, and a high work function material may be used in addition to or in place of the polysilicon in contact with the tunneling dielectric structure 730.

The memory cell of FIG. 7 can be efficiently erased using an inverse polarity (a positive voltage from the gate to the substrate) to those described above with reference to FIGS. 5 and 6 and the variations. For example, a first erase step applied to the memory cell comprising an initial large voltage from the gate 760 to the substrate 705 (for example +18 Volts) for a predetermined period of time (for example 2 msec) can induce FN hole tunneling from the gate 760 to the dielectric charge trapping structure 740 and reduces the threshold voltage of the memory cell. For a second erase step, the magnitude of the applied voltage from the gate to the substrate is reduced (for example to +17.5 Volts) to further reduce the threshold voltage of the memory cell. The magnitude of the applied voltage from the gate to the substrate can continue to decrease for each subsequent erase step. Additionally, the erase time may be increased for each subsequent erase time as described above with reference to FIG. 6.

Although FIG. 7 illustrates an exemplary BE-SONOS device that can erased by the efficient techniques described herein using FN hole tunneling from the gate to the charge trapping layer, the efficient techniques described herein can be applied to other types of dielectric charge trapping structures also.

Erase saturation occurs when the charge stored in the dielectric charge trapping layer reaches an equilibrium value due to electron injection from one of the substrate and gate and hole tunneling from the other of the gate and substrate. A strong electric field between the gate and the substrate increases the erase speed of the device, but also increases the electron injection and leads to a higher erase saturation voltage for the device. The present invention initially applies a bias to create a strong electric field between the gate and the substrate so as to increase the erase speed of the device, and then changes the bias to reduce the electric field between the gate and the substrate so as to avoid erase saturation and obtain a lower threshold voltage. Thus, memory cells can be erased more quickly while also avoiding the issues of erase saturation.

The erase algorithms described herein can be applied to memory cells arranged in NAND-type, AND-type, NOR-type, virtual ground-type, as well as other array configurations.

Figure 8:
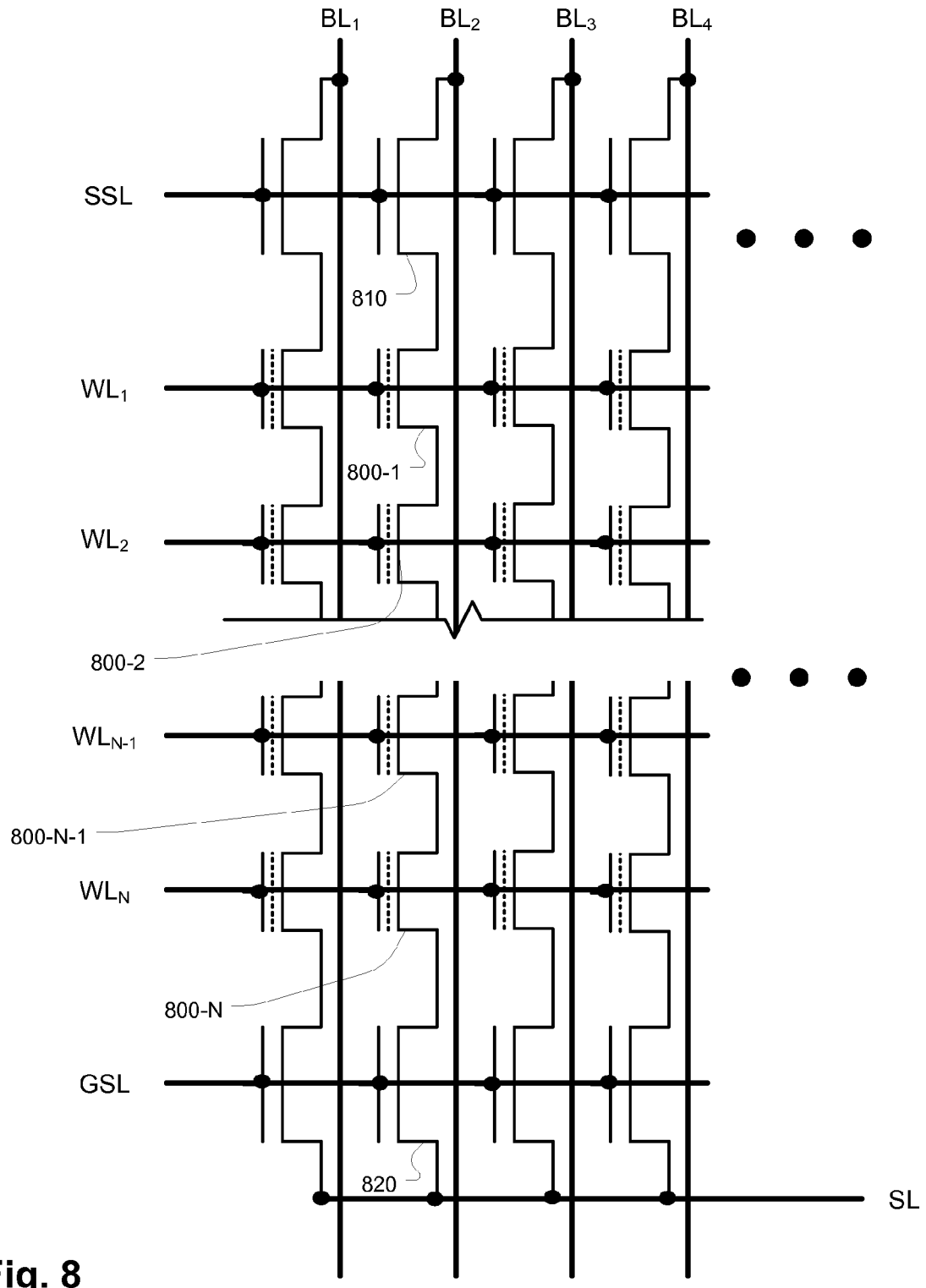
FIG. 8 illustrates dielectric charge trapping memory cells arranged in a NAND array structure on a substrate.

FIG. 8 illustrates dielectric charge trapping memory cells arranged in a NAND array structure on a substrate. The array includes a plurality of bit lines $BL_1$, $BL_2$, $BL_3$, $BL_4$, ... and a plurality of word lines $WL_1$, $WL_2$, ... $WL_{N-1}$, $WL_N$. Groups of N memory cells are connected in series between a string select transistor coupled to a corresponding bit line and a ground select transistor coupled to a source line SL. A string select line SSL is coupled to the gates of a row of string select transistors, and a ground select line GSL is coupled to the gates of a row of ground select transistors. Thus, for a representative bit line $BL_2$ a string select transistor 810 connects a series of memory cells 800-1 through 800-N to the bit line $BL_2$ in response to the signal on the string select line SSL. The last memory cell 800-N in the series is connected to ground select transistor 820 which couples the series to the source line SL in response to the signal on the ground select line GSL.

Programming may be accomplished in the NAND array by applying incremental stepped pulse programming ISPP or other processes. ISPP involves applying a stepped programming voltage, starting at a gate bias of for example about +17 Volts, and incrementing the voltage for each programming step by about 0.2 V. Each pulse can have a constant pulse width of about 10 μs for example. In variations of the technique, the pulse width and the increment applied for each succeeding pulse can be varied to meet the needs of the particular implementation. The memory cells of this type have demonstrated relatively linear programming characteristics, and very large memory windows compared to the prior art, making them particularly well-suited to storing multiple bits per cell with multilevel programming technologies. Other biasing arrangements can be applied as well, selected for compatibility with array characteristics.

The memory cells in the NAND array can be erased using the efficient erase algorithms described above with reference to FIGS. 5, 6 and 7, thus avoiding erase saturation issues and resulting in lower threshold voltages for the memory cells. For example, during erase the SSL and the GSL can be set to 0 Volts, and the source line SL and bit lines BL can be floating or set to the same voltage as the substrate.

During erase, an initial voltage is applied from the word lines to the substrate (for example, −18 V applied to the word lines, and 0 V applied to the substrate) to induce FN hole tunneling from the substrate to the dielectric charge trapping structure of the memory cells to reduce the threshold voltage of the memory cells. Next, the magnitude of the applied erase voltage from the word lines to the substrate is reduced (for example, −17.5 V applied to the word lines, and 0 V applied to the substrate). The magnitude of the applied erase voltage from the word lines to the substrate can continue to be decreased, for example, according to equation (1) for each erase step. As was described above with reference to FIGS. 5 and 6, variations to the erase algorithm for erasing the memory cells can be implemented including changing the substrate voltage or changing both the word line voltages and the substrate voltage in linear or non-linear fashions. Additionally, the erase time can also be changed for each subsequent erase step as was described above.

Figure 9A:
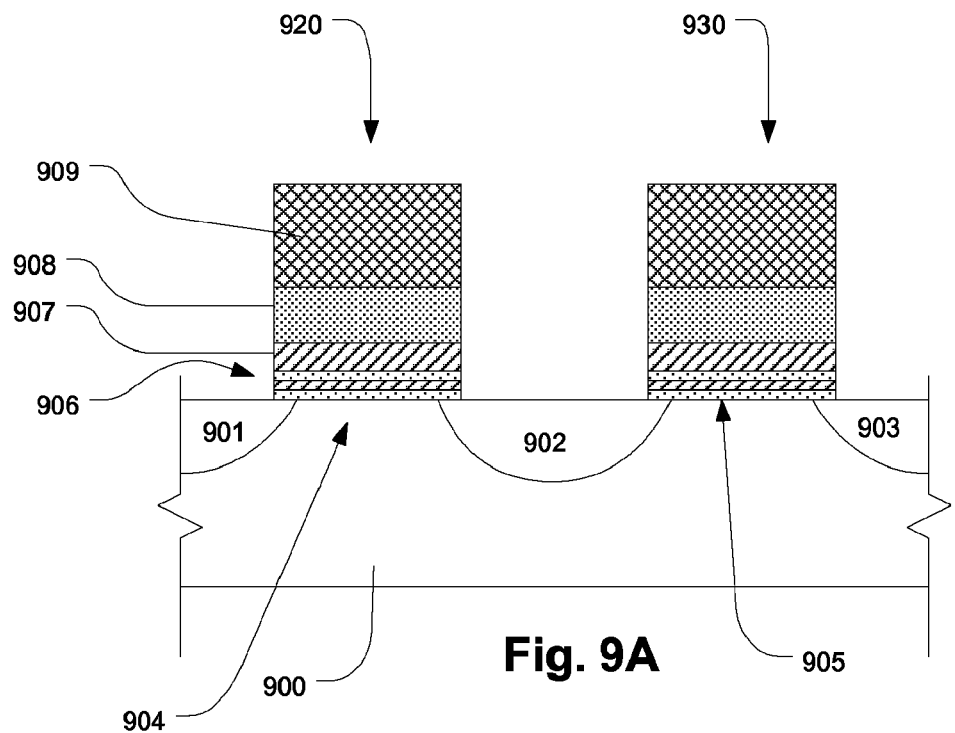
FIGS. 9A and 9B illustrate cross-sectional views of a representative BE-SONOS memory cell structure implemented in a NAND-type array, taken across the word lines and along the word line respectively.
Figure 9B:
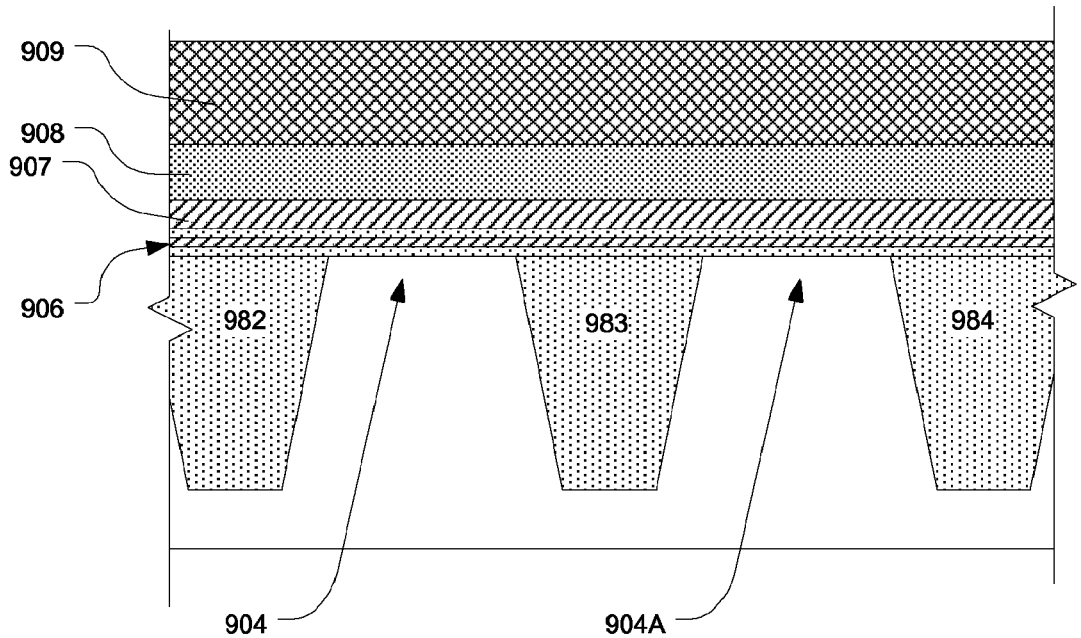

FIGS. 9A and 9B show cross-sectional views of a representative BE-SONOS memory cell structure as described herein implemented in a NAND-type array, taken across the word lines and along the word line respectively. As will be understood, alternatively other dielectric charge trapping memory cells can be implemented.

FIG. 9A shows a semiconductor substrate 900 including channel regions 904, 905 and doped source/drain terminals 901, 902, 903 contacting the channel regions. The dielectric charge trapping memory cells 920, 930 are arranged in stacks over the channel regions 904 and 905 respectively. Memory cell 920 is representative and includes a dielectric tunneling structure 906 over the channel 904, a dielectric charge trapping layer 907 over the dielectric tunneling structure 906, a blocking dielectric layer 908 over the charge trapping layer 907, and a word line 909 over the blocking dielectric layer 908, the word line 909 extending into and out of the cross-section illustrated in FIG. 9A and acting as the gate for the memory cell 920. In one embodiment the channel length between the source and drain terminals can be less than 50 nm, for example being 30 nm or less.

FIG. 9B shows the structure of FIG. 9A taken in cross-section along word line 909 and includes the same stack with the same reference numerals as described with reference to FIG. 9A. Columns of series connected memory cells are separated by shallow trench isolation structures 982, 983, 984. In the illustration, the surfaces of the channel 904 and the adjacent channel 904A are planar. Implementations of the device may include recessed (concave) channel surfaces in this cross-section, or extended (convex) channel surfaces, depending on the manufacturing techniques and the desired product. The tunneling structure 906 and the rest of stack 907, 908, 909 overlie the channel surfaces, whether planar, concave or convex, in a conformal manner. The channel width between the STI structures in one embodiment is less than 50 nm, and preferably as small as the STI techniques allow.

Figure 10:
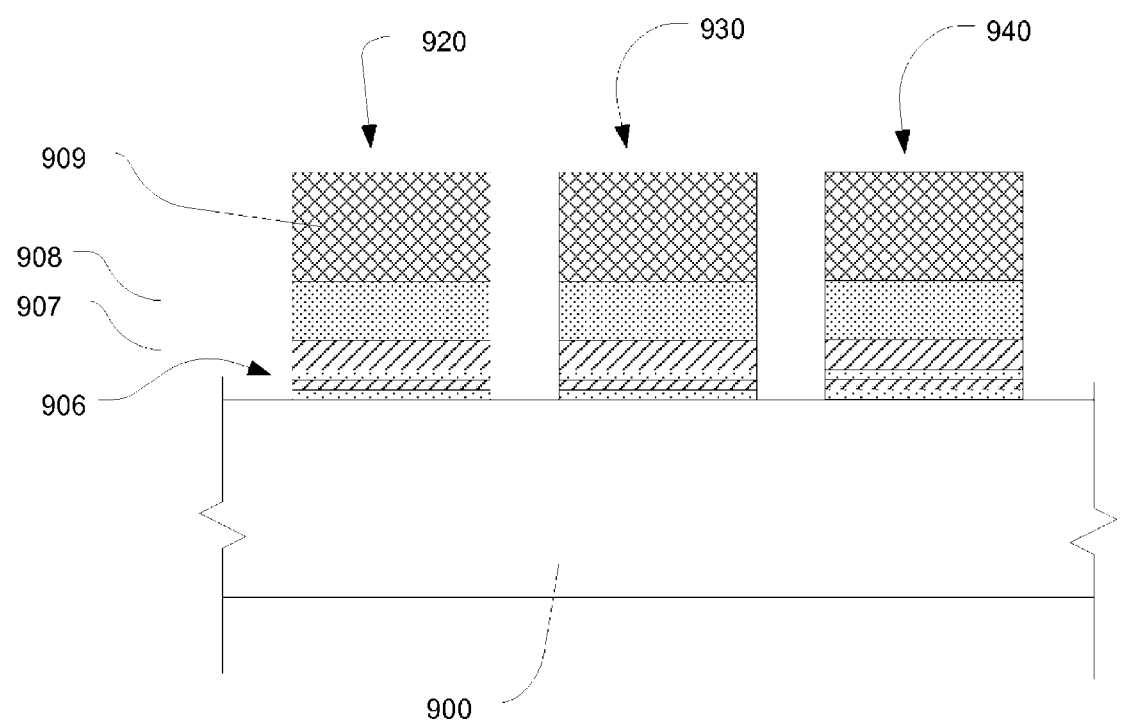
FIG. 10 illustrates a cross-sectional view of a NAND array taken across the word lines of an alternative embodiment to that illustrated in FIG. 9A.

FIG. 10 illustrates a cross-sectional view of a NAND array taken across the word lines of an alternative embodiment to that illustrated in FIG. 9A. FIG. 10 illustrates a split gate NAND array which may be used to achieve a more aggressive memory cell density. As illustrated in FIG. 10, the spaces between the memory cells 920, 930, 940 may be reduced such that an inversion layer extends under the memory cells 920, 930, 940 when sufficient voltages are applied to all the word lines acting as gates for the memory cells. Thus, the memory cells can be arranged such that no diffusion regions are necessary between the memory cells 920, 930, 940. In some embodiments a series of memory cells including a string select transistor and a ground select transistor will contain just two diffusion regions, one adjacent to each of the select transistors on either end of the series of memory cells. For further information on split gate memory cells and methods for manufacturing, reference is made to the above incorporated by reference U.S. Patent Application Publication No. US 2006/0198189 A1, entitled "Non-Volatile Memory Cells, Memory Arrays Including the Same and Methods of Operating Cells and Arrays".

Figure 11:
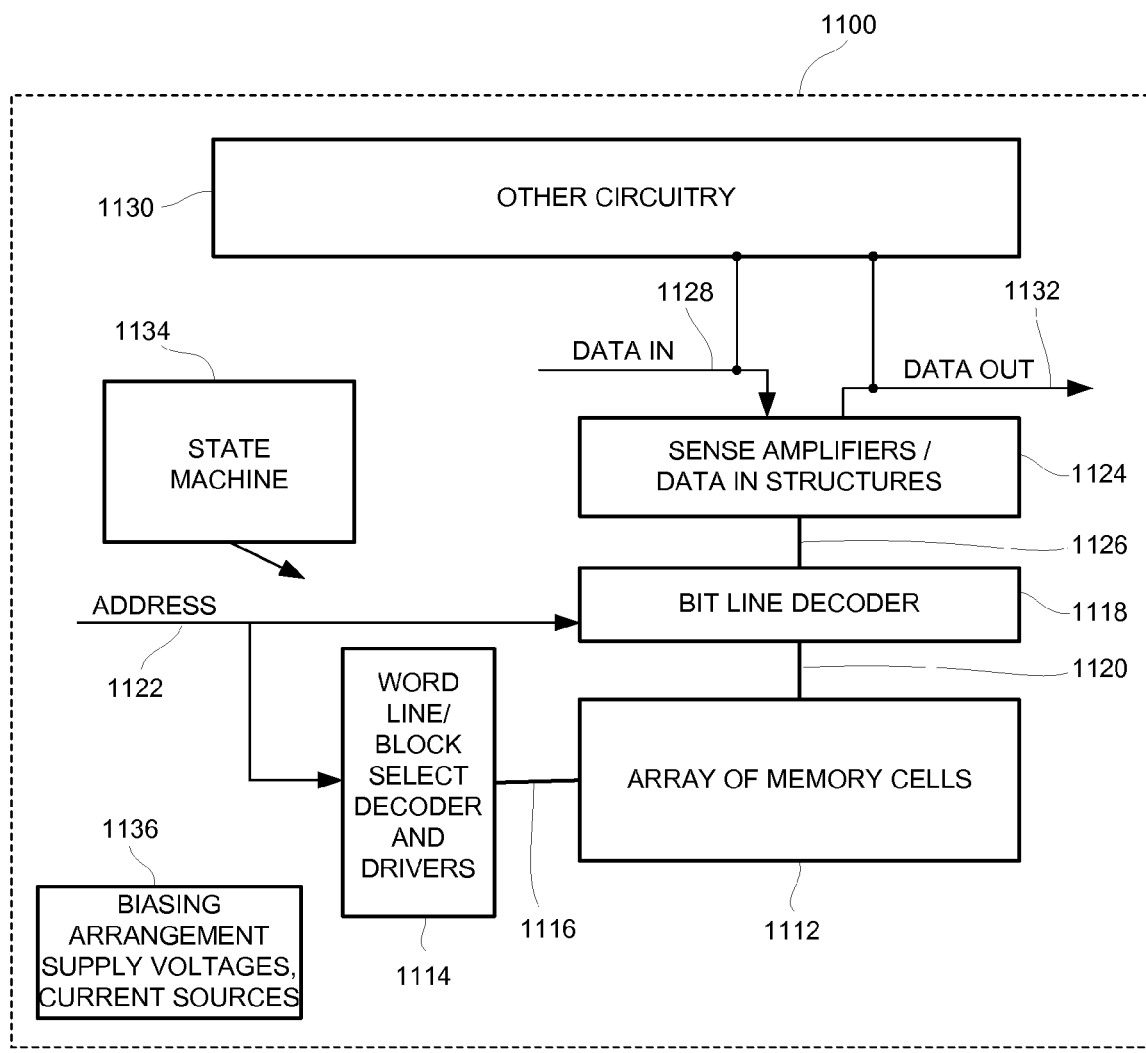
FIG. 11 illustrates a simplified block diagram of an integrated circuit 1100 in which the present invention may be implemented.

FIG. 11 is a simplified block diagram of an integrated circuit 1100 in which the present invention may be implemented. The integrated circuit 1100 includes a memory array 1112 implemented using dielectric charge trapping memory cells on a semiconductor substrate. A word line (or row) and block select decoder 1114 is coupled to, and in electrical communication with, a plurality 1116 of word lines and string select lines, and arranged along rows in the memory array 1112. A bit line (column) decoder and drivers 1118 are coupled to and in electrical communication with a plurality of bit lines 1120 arranged along columns in the memory array 1112 for reading data from, and writing data to, the memory cells in the memory array 1112. Addresses are supplied on bus 1122 to the word line decoder and drivers 1114 and to the bit line decoder 1118. Sense amplifiers and data-in structures in block 1124, including current sources for the read, program and erase modes, are coupled to the bit line decoder 1118 via the bus 1126. Data is supplied via the data-in line 1128 from input/output ports on the integrated circuit 1110, to the data-in structures in block 1124. In the illustrated embodiment, other circuitry 1130 is included on the integrated circuit 1100, such as a general purpose processor or special purpose application circuitry, or a combination of modules providing system-on-a-chip functionality supported by the memory cell array. Data is supplied via the data-out line 1132 from the sense amplifiers in block 1124 to input/output ports on the integrated circuit 1100, or to other data destinations internal or external to the integrated circuit 1100.

The array 1112 can be a NAND array, an AND array or a NOR array, depending on the particular application.

A controller implemented in this example, using bias arrangement state machine 1134, controls the application of bias arrangement supply voltages and current sources 1136, such as read, program, efficient erase as described herein, erase verify, program verify voltages or currents for the word line and bit lines, and controls the word line/source line operation using an access control process. The controller 1134 may be implemented using special purpose logic circuitry as known in the art. In alternative embodiments, the controller 1134 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising:
a memory cell having a threshold voltage and comprising a substrate, a first dielectric structure overlying the substrate, a charge trapping structure overlying the first dielectric structure, a second dielectric structure overlying the charge trapping structure, and a gate overlying the second dielectric structure; and
a bias arrangement state machine to apply a bias arrangement to the memory cell to change the threshold voltage of the memory cell from a first threshold state to a second threshold state, the bias arrangement comprising:
a first voltage applied from the gate to the substrate to change the threshold voltage of the memory cell from the first threshold state; and
a second voltage applied from the gate to the substrate after the first voltage, to change the threshold voltage of the memory to the second threshold state, wherein the second voltage has a lower magnitude from the gate to the substrate than that of the first voltage.

2. The memory device of claim 1, wherein the bias arrangement comprises a voltage applied to the substrate being increased and a voltage applied to the gate being maintained between the first and second voltages.

3. The memory device of claim 1, wherein the bias arrangement comprises a voltage applied to the substrate being maintained and a voltage applied to the gate being reduced between the first and second voltages.

4. The memory device of claim 1, wherein the bias arrangement induces charge tunneling from the substrate to the charge trapping structure to reduce the threshold voltage of the memory cell.

5. The memory device of claim 1, wherein the bias arrangement induces charge tunneling from the gate to the charge trapping structure to reduce the threshold voltage of the memory cell.

6. The memory device of claim 1, wherein the first dielectric structure comprises:
 a first oxide layer on the substrate;
 a nitride layer on the first oxide layer; and
 a second oxide layer on the nitride layer, wherein the charge trapping structure is on the second oxide layer.

7. The memory device of claim 1, wherein the second dielectric structure comprises:
 a first oxide layer on the charge trapping structure;
 a nitride layer on the first oxide layer; and
 a second oxide layer on the nitride layer, wherein the gate is on the second oxide layer.

8. A memory device comprising:
 a memory cell including a charge storage element; and
 a bias arrangement state machine to apply a bias arrangement to the memory cell to change the charge storage element from a first charge storage state to a second charge storage state, the bias arrangement comprising:
  a first voltage applied across the charge storage element to change the charge storage element from the first charge storage state to an intermediate charge storage state; and
  a second voltage applied across the charge storage element to change the charge storage element from the intermediate charge storage state to the second charge storage state, wherein the second voltage has a lower magnitude across the charge storage element than that of the first voltage.

9. A memory device comprising:
 a memory cell; and
 a bias arrangement state machine to apply a bias arrangement for adjusting the memory cell from a first storage state to a second storage state, the bias arrangement comprising a sequence of voltages, wherein a preceding voltage in the sequence of voltages has a larger magnitude than that of a subsequent voltage in the sequence of voltages.

* * * * *